(12) United States Patent
Cheng

(10) Patent No.: US 7,333,037 B2
(45) Date of Patent: Feb. 19, 2008

(54) METHOD AND SYSTEM FOR IMPROVED LOOKUP TABLE (LUT) MECHANISM FOR HUFFMAN DECODING

(75) Inventor: Taiyi Cheng, San Jose, CA (US)

(73) Assignee: Broadcom Corporation, Irvine, CA (US)

( * ) Notice: Subject to any disclaimer, the term of this patent is extended or adjusted under 35 U.S.C. 154(b) by 0 days.

(21) Appl. No.: 11/353,530

(22) Filed: Feb. 14, 2006

(65) Prior Publication Data

US 2007/0188352 A1    Aug. 16, 2007

(51) Int. Cl.
    *H03M 7/40* (2006.01)
(52) U.S. Cl. .................. 341/67; 341/106; 341/107; 341/65
(58) Field of Classification Search ............ 341/65, 341/67, 106, 107
    See application file for complete search history.

(56) References Cited

U.S. PATENT DOCUMENTS

| | | | | |
|---|---|---|---|---|
| 5,969,650 A * | 10/1999 | Wilson | ............ | 341/67 |
| 5,999,111 A * | 12/1999 | Park et al. | ............ | 341/67 |
| 6,373,412 B1 * | 4/2002 | Mitchell et al. | ............ | 341/65 |
| 6,778,107 B2 * | 8/2004 | Wang et al. | ............ | 341/65 |
| 6,842,124 B2 * | 1/2005 | Penna | ............ | 341/67 |
| 6,891,976 B2 * | 5/2005 | Zheltov et al. | ............ | 382/246 |
| 7,129,864 B2 * | 10/2006 | Jahanghir et al. | ............ | 341/106 |
| 7,132,963 B2 * | 11/2006 | Pearlstein et al. | ............ | 341/67 |
| 7,199,738 B2 * | 4/2007 | Han et al. | ............ | 341/143 |
| 2003/0052802 A1 * | 3/2003 | Wang et al. | ............ | 341/65 |
| 2003/0128140 A1 * | 7/2003 | Xie et al. | ............ | 341/107 |
| 2003/0174898 A1 * | 9/2003 | Zheltov et al. | ............ | 382/246 |

OTHER PUBLICATIONS

Pi-Chung Wang, Yuan-Rung Yang, Chun-Liang, and Hung-Yi Chang, A Memory-Efficient Huffman Decoding Algorithm, Proceeding of 19th International Conference on Advanced Information Networking and Applications, 2005, 5 pages, The Institute of Electrical & Electronics Engineers, USA, no month.

* cited by examiner

*Primary Examiner*—Linh Nguyen
(74) *Attorney, Agent, or Firm*—McAndrews, Held & Malloy, Ltd.

(57) ABSTRACT

Methods and systems for improved lookup table mechanism for Huffman decoding are provided and may include selecting, based on a plurality of entropy encoded bits from a received bitstream, one of a plurality of codewords that is indexed according to a specific length and that points to all entries which include the specific length. The plurality of entropy encoded bits from the received bitstream may be matched with at least one of the entries that include the specific length. The entries that include the specific length may be stored in a table in memory. A value of the plurality of entropy encoded bits may be compared with the selected one of the plurality of codewords that is indexed according to specific length. The plurality of entropy encoded bits from the received bitstream may be decoded based on the matched at least one of the entries comprising the specific length.

21 Claims, 11 Drawing Sheets

METHOD AND SYSTEM FOR IMPROVED LOOKUP TABLE (LUT) MECHANISM FOR HUFFMAN DECODING

CROSS-REFERENCE TO RELATED APPLICATIONS/INCORPORATION BY REFERENCE

This application makes reference to:

U.S. application Ser. No. 11/353,528 filed Feb. 14, 2006;

U.S. application Ser. No. 11/353,529 filed Feb. 14, 2006; and

U.S. application Ser. No. 11/353,367 filed Feb. 14, 2006.

The above stated applications are hereby incorporated herein by reference in their entirety.

FIELD OF THE INVENTION

Certain embodiments of the invention relate to controlling the processing of signals. More specifically, certain embodiments of the invention relate to a method and system for an improved lookup table (LUT) mechanism for Huffman decoding.

BACKGROUND OF THE INVENTION

The growing computational complexity and data rate requirements of new multimedia applications demand that signal processing systems provide efficient and flexible compression and decompression routines. With a plurality of image and video coding and decoding standards available, the signal processing system may have to be flexible enough to implement at least one of these standards. Examples of image and video coding and decoding standards that may be used in various user devices comprise Joint Photographic Experts Group (JPEG), Moving Picture Experts Group (MPEG), and H.263 standard published by the International Telecommunications Union (ITU).

The JPEG standard utilizes a lossy compression technique for compressing still images based on the discrete cosine transform (DCT) and the inverse cosine transform (IDCT) for coding and decoding operations respectively. The JPEG standard is rarely used in video, but it forms the basis for motion-JPEG (M-JPEG) which may be used in desktop video editing and digital video (DV) compression, a compression and data packing scheme used in consumer digital video cassette recorders and their professional derivatives. In the JPEG standard an 8×8 array of sample data known as a video data block may be used for processing, where the sample data may correspond to luminance (Y) or chrominance (Cr and Cb) information of the still image or video signal. Four 8×8 blocks of luminance, an 8×8 block of Cr, and an 8×8 block of Cb data is known in JPEG terminology as a minimum coded unit (MCU) and it corresponds to a macroblock in DV or MPEG terminology.

The MPEG standard is also based on the DCT/IDCT pair and may provide intraframe or interframe compression. In interframe compression, there may be an anchor or self-contained image in a video field that provides a base value and succeeding images may be coded based on their differences to the anchor. In intraframe compression, each image in a video field is compressed or coded independently from any other image in a video sequence. The MPEG standard specifies what may constitute a legal bitstream, that is, it provides guidelines as to what is a conformant encoder and decoder but does not standardize how an encoder or a decoder may accomplish the compression or decompression operations respectively.

The H.263 standard may support video coding and decoding for video-conferencing and video-telephony application. Video-conferencing and video-telephony may have a wide range of wireless and wireline applications, for example, desktop and room based conferencing, video over the Internet and over telephone lines, surveillance and monitoring, telemedicine, and computer-based training and education. Like MPEG, the H.263 standard specifies the requirements for a video encoder and decoder but does not describe the encoder and decoder themselves. Instead, the H.263 standard specifies the format and content of the encoded bitstream. Also like MPEG and JPEG, the H.263 standard is also based on the DCT/IDCT pair for coding and decoding operations.

The encoding and decoding operations specified by, for example, the JPEG, MPEG, and H.263 standards may be implemented in software to be run on signal processing integrated circuits (IC) with embedded processors such as systems-on-a-chip (SoC). These SoC image and video (IV) solutions need to be highly effective in terms of performance, cost, power and flexibility. However, processor-based SoC devices where these operations may run efficiently are proving difficult to implement. This difficulty arises because system software and/or other data processing applications executed on the embedded processor demand a large portion of the computing resources available on the SoC, limiting the ability of the coding and decoding operations to be performed as rapidly as may be required for a particular data transmission rate.

In addition, decoding operations specified by, for example, the JPEG, MPEG, and H.263 standards, may utilize computation-intensive algorithms, such as a Huffman decoding algorithm. In this regard, Huffman decoding may utilize a large portion of on-chip computing and memory resources, which may increase processing time and decrease overall system efficiency. The use of embedded digital signal processors (DSP) in an SoC design may provide the increased computational speed needed to execute coding and decoding software using Huffman encoding/decoding algorithms. However, this approach may prove to be costly because an embedded DSP is a complex hardware resource that may require a large portion of the area available in an SoC design. Furthermore, additional processing hardware, for example an embedded processor or a microcontroller, may still be required to provide system level control and/or other functions for the signal processing IC.

Further limitations and disadvantages of conventional and traditional approaches will become apparent to one of skill in the art, through comparison of such systems with some aspects of the present invention as set forth in the remainder of the present application with reference to the drawings.

BRIEF SUMMARY OF THE INVENTION

A system and/or method is provided for an improved lookup table (LUT) mechanism for Huffman decoding, substantially as shown in and/or described in connection with at least one of the figures, as set forth more completely in the claims.

These and other advantages, aspects and novel features of the present invention, as well as details of an illustrated embodiment thereof, will be more fully understood from the following description and drawings.

DETAILED DESCRIPTION OF THE INVENTION

Certain embodiments of the invention may be found in a method and system for an improved lookup table (LUT) mechanism for Huffman decoding. Aspects of the method may comprise selecting, based on a plurality of entropy encoded bits from a received bitstream, one of a plurality of codewords that is indexed according to a specific length and that points to all entries comprising the specific length. The plurality of entropy encoded bits from the received bitstream may be matched with at least one of the entries comprising the specific length. The entries may be stored in a table in memory. A value of the plurality of entropy encoded bits may be compared with the selected codeword. The value of the plurality of entropy encoded bits may include a binary value. If the value of the plurality of entropy encoded bits is greater than the selected codeword, the value of the entropy encoded bits may be compared with another codeword. If the value of the plurality of entropy encoded bits is not greater than the selected codeword, the plurality of entropy encoded bits may be matched with the at least one of the entries comprising the specific length, based on the selected codeword. The plurality of entropy encoded bits from the received bitstream may be decoded based on the matched entry comprising the specific length.

Figure 1:
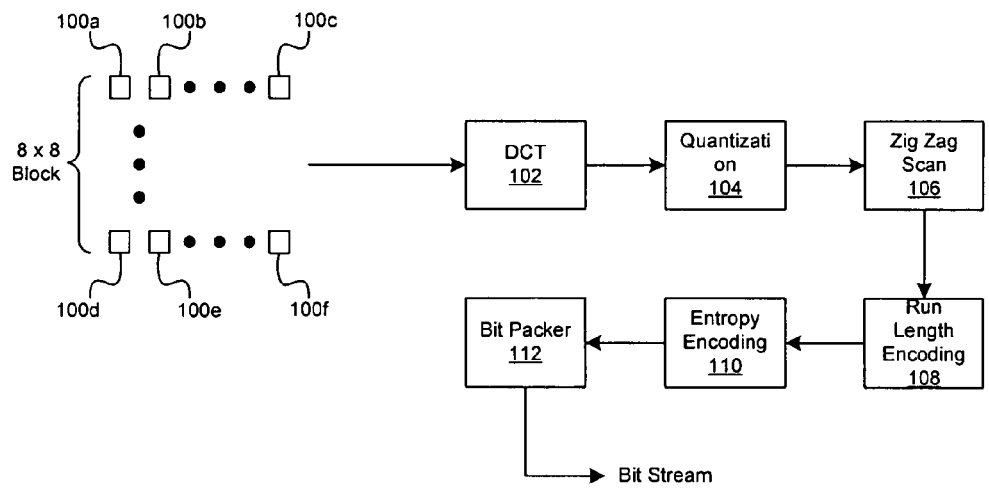
FIG. 1 is block diagram illustrating exemplary encoding process, in accordance with an embodiment of the invention.

FIG. 1 is block diagram illustrating exemplary encoding process, in accordance with an embodiment of the invention. Referring to FIG. 1 there is shown an 8×8 pixel block 100, a discrete cosine transform (DCT) block 102, a quantization block 104, a zigzag scan block 106, a run length encoding (RLC) block 108, an entropy encoding block 110, and a bit packer block 112.

The 8×8 pixel block 100 may comprise pixels arranged in rows and columns in which each of the 8 rows may comprise 8 pixels. The pixels 100a, 100b . . . 100c may represent pixels in a first row of the 8×8 pixel block 100. The pixels 100d, 100e . . . 100f may represent pixels in a subsequent row of the 8×8 pixel block 100. Each pixel in the 8×8 pixel block 100 may comprise luminance (Y), chrominance U (U) information, and/or chrominance V (V) information. The Y, U, and/or V information may correspond to a pixel in an image frame, for example. The Y, U, and/or V information associated with a pixel may be referred to as a YUV representation. The YUV representation for a pixel may be derived from a corresponding representation of the pixel as comprising red (R) information, green (G) information, and/or blue (B) information.

The DCT block 102 may comprise suitable logic, circuitry and/or code that may enable discrete cosine transformation of the 8×8 pixel block 100. The DCT block 102 may enable computation of transformed values corresponding to values, for example YUV values, associated with the pixels 100a, 10b . . . 100c, 10d, and 100e . . . 100f, contained within the 8×8 pixel block 100. The pixels in the 8×8 pixel block 100 may comprise values associated with intensities associated with YUV information. The transformed values computed by the DCT block 102 may comprise a frequency representation of values in the YUV representation. For example, the transformed values may indicate high frequency components and low frequency components associated with the 8×8 pixel block 100. High frequency components may represent areas in the 8×8 pixel block 100 where there may be a rapid change in intensity values among pixels. The resulting 8×8 block of transformed values may comprise 8 rows with each row comprising a plurality of 8 transformed values, for example.

The quantization block 104 may comprise suitable logic, circuitry and/or code that may enable quantization of the transformed values computed by the DCT block 102. The quantization may comprise deriving a binary representation of the corresponding transformed value computed by the DCT block 102. The corresponding transformed value may represent a numerical value. The binary value associated with the binary representation may not be equal to the corresponding transformed value computed by the DCT block 102. A difference between the binary value and the corresponding transformed value may be referred to as quantization error. The quantization block 104 may utilize a number of bits in a binary representation based on a numerical value of the corresponding transformed value.

The zigzag scan block 106 may comprise suitable logic, circuitry and/or code that may enable selection of quantized values from a block of quantized values. For example, the zigzag scan block 106 may implement a raster scan of an 8×8 block of quantized values. The zigzag scan block 106 may convert the representation of the quantized values from a block of 64 individual binary values, to a single concatenated string of binary values, for example. In the concatenated string of binary values, a binary value associated with the second quantized value in the 8×8 block of quantized values may be appended to a binary value associated with the first quantized value to form a single binary number, for example.

The run length encoding (RLC) block 108 may comprise suitable logic, circuitry and/or code that may be utilized to reduce redundancy in the concatenated string of binary values generated by the zigzag scan block 106. If the concatenated string of binary values comprises a contiguous substring of consecutive binary '0' values, for example, the RLC block 108 may replace the contiguous substring with an alternative representation that indicates the number of consecutive binary '0' values that were contained in the original concatenated string of binary values. The alternative representation may comprise fewer binary bits than the contiguous substring. The RLC block 108 may generate a RLC bit stream.

The entropy encoding block 110 may comprise suitable logic, circuitry and/or code that may enable entropy encoding of the RLC bit stream from the RLC block 108. In one embodiment of the invention, the entropy encoding block 110 may comprise a Huffman encoder. In this regard, the entropy encoder block 110 may be referred to as a Huffman encoding block 110. Notwithstanding, the invention is not limited in this regard, and other types of entropy encoders may be utilized. In this regard, various exemplary embodiments of the invention may utilize Huffman encoding, arithmetic encoding, and unary encoding, Elias gamma encoding, Fibonacci encoding, Golomb encoding, Rice encoding and/or other encoding scheme. The RLC bit stream may comprise groups of contiguous bits, for example, 8 bits. Each group of 8 bits may correspond to a symbol. Entropy encoding may enable data compression by representing the symbol with an entropy encoded representation that comprises fewer bits. Each of the plurality of symbols may comprise an equal number of bits. Each of the plurality of symbols from the RLC bit stream may be entropy encoded to form a plurality of symbols. Each of the entropy encoded symbols may comprise a varying numbers of bits. The entropy encoded version of the RLC bit stream may comprise fewer bits than may be in the original RLC bit stream.

The bit packer block 112 may comprise suitable logic, circuitry and/or code that may enable insertion of stuff bits into the entropy encoded bit stream generated by the entropy encoding block 110. The entropy encoded bit stream may comprise a plurality of bits. That number of bits may not be an integer multiple of 8, for example. Such an entropy encoded bit stream may not be aligned to an 8 bit byte, or to a data word wherein the length of the data word is an integer multiple of 8. The bit packer block 112 may insert stuff bits into the entropy encoded bit stream such that the total of the number of bits in the entropy encoded bit stream and the number of stuff bits may be an integer multiple of 8, or an integer multiple of the number of bits in a data word. The bit stuffed version of the entropy encoded bit stream may be referred to as being byte aligned, or word aligned. The binary value of each stuff bit may be a determined value, for example, a binary '0' value. The resulting bit stream may be stored in memory, for example.

Figure 2:
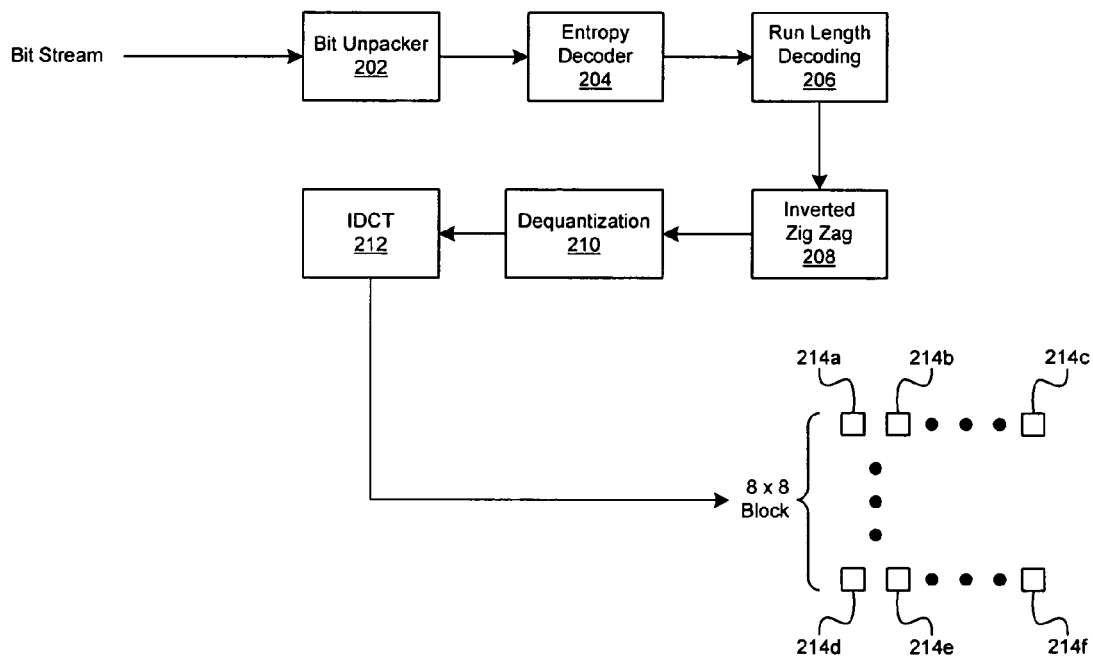
FIG. 2 is block diagram illustrating exemplary decoding process, in accordance with an embodiment of the invention.

FIG. 2 is block diagram illustrating exemplary decoding process, in accordance with an embodiment of the invention. Referring to FIG. 1 there is shown a bit unpacker block 202, an entropy decoding block 204, a run length decoding (RLDC) block 206, an inverted zigzag scan block 208, a de-quantization block 210, an inverse discrete cosine transform (IDCT) block 212, and an 8×8 pixel block 214.

The bit unpacker block 202 may comprise suitable logic, circuitry and/or code that may enable removal of stuffed bits from a byte-aligned bit stream. The stuff bits may have previously been inserted into the bit stream. The entropy decoder block 204 may comprise suitable logic, circuitry and/or code that may enable entropy decoding of the bit stream received from the bit unpacker block 202. Entropy decoding may comprise a data expansion method by which a previously entropy encoded symbol is decoded. In one embodiment of the invention, the entropy encoding block 204 may comprise a Huffman decoder. In this regard, the entropy decoder block 204 may be referred to as a Huffman encoding block 204. Notwithstanding, the invention is not limited in this regard, and other types of entropy decoders may be utilized. In this regard, various exemplary embodiments of the invention may utilize Huffman decoding, arithmetic decoding, unary decoding, Elias gamma decoding, Fibonacci decoding, Golomb decoding, Rice decoding and/or other types encoding schemes.

In one embodiment of the invention, the Huffman decoding block may utilize an improved 2-level Huffman decoding table. The 2-level Huffman decoding table may comprise an index table and a plurality of sub-tables, or sub-arrays comprising Huffman codes arranged according to code size. The index table may record the first entry of each sub-table and entries in the index table may be arranged according to code size. In this regard, an exemplary Huffman code lookup operation during video decoding may be performed using fewer table lookup cycles compared to conventional Huffman decoding lookup algorithms.

The entropy decoder block 204 may receive a plurality of encoded symbols contained in a received bit stream. Each of the entropy encoded symbols may comprise a variable number of bits. The entropy decoding block 204 may decode each of the plurality of entropy encoded symbols to generate a corresponding plurality of entropy decoded symbols. Each of the plurality of entropy decoded symbols may comprise an equal number of bits. The run length decoding (RLDC) block 206 may comprise suitable logic, circuitry and/or code that may enable processing of a bit stream received from the entropy decoding block 204 comprising entropy decoded symbols. The RLDC block 206 may utilize RLC information contained in the received bit stream to insert bits into the bit stream. The inserted bits may comprise a contiguous substring of consecutive binary '0' values, for example. The RLDC block 206 may generate an RLDC bit stream in which RLC information in the received bit stream may be substituted for corresponding inserted bits.

The inverted zigzag scan block 208 comprise suitable logic, circuitry and/or code that may enable processing of an RLDC bit stream received from the RLDC block 206. The inverted zigzag scan block 208 may enable conversion a single received bit stream into a plurality of binary values. For example, the RLDC may generate 64 binary values, for example. The plurality of binary values may be arranged in a block, for example, an 8×8 block. The first 8 binary values may be associated with a first row in the 8×8 block, the second 8 binary values may be associated with a second row, and the last 8 binary values may be associated with a last row, for example.

The de-quantization block 210 may comprise suitable logic, circuitry and/or code that may enable processing of a received block of values from the inverted zigzag scan block 208. The de-quantization block 210 may enable inverse quantization of the received block of values. Inverse quantization may comprise determining a numerical value based on a binary value. The numerical value may comprise a base 10 representation of the corresponding binary value. The de-quantization block 210 may also enable inverse quantization for each of the binary values contained in a received block of values. The de-quantization block may generate a corresponding block of numerical values.

The IDCT block 212 may comprise suitable logic, circuitry and/or code that may enable processing of a received block of numerical values from the de-quantization block 210. The received block of numerical values may comprise a frequency representation of YUV information associated with the 8×8 block 214. The IDCT block 212 may perform an inverse discrete cosine transform on the received block of numerical values. The inverse discrete cosine transformed block of numerical values may comprise a corresponding block of YUV information associated with the 8×8 block 214. The YUV information resulting from the inverse discrete cosine transformation may be stored in memory.

The 8×8 block 214 may comprise pixels arranged in rows and columns where each row may comprise 8 pixels with 8 rows in the 8×8 block. The pixels 214a, 214b . . . 214c may represent pixels in a first row of the 8×8 block. The pixels 214d, 214e . . . 214f may represent pixels in a subsequent row of the 8×8 block. Each of the pixels in the 8×8 block 214 may comprise YUV information, for example. The YUV information may be retrieved from memory and converted to an RGB representation during post processing.

Figure 3:
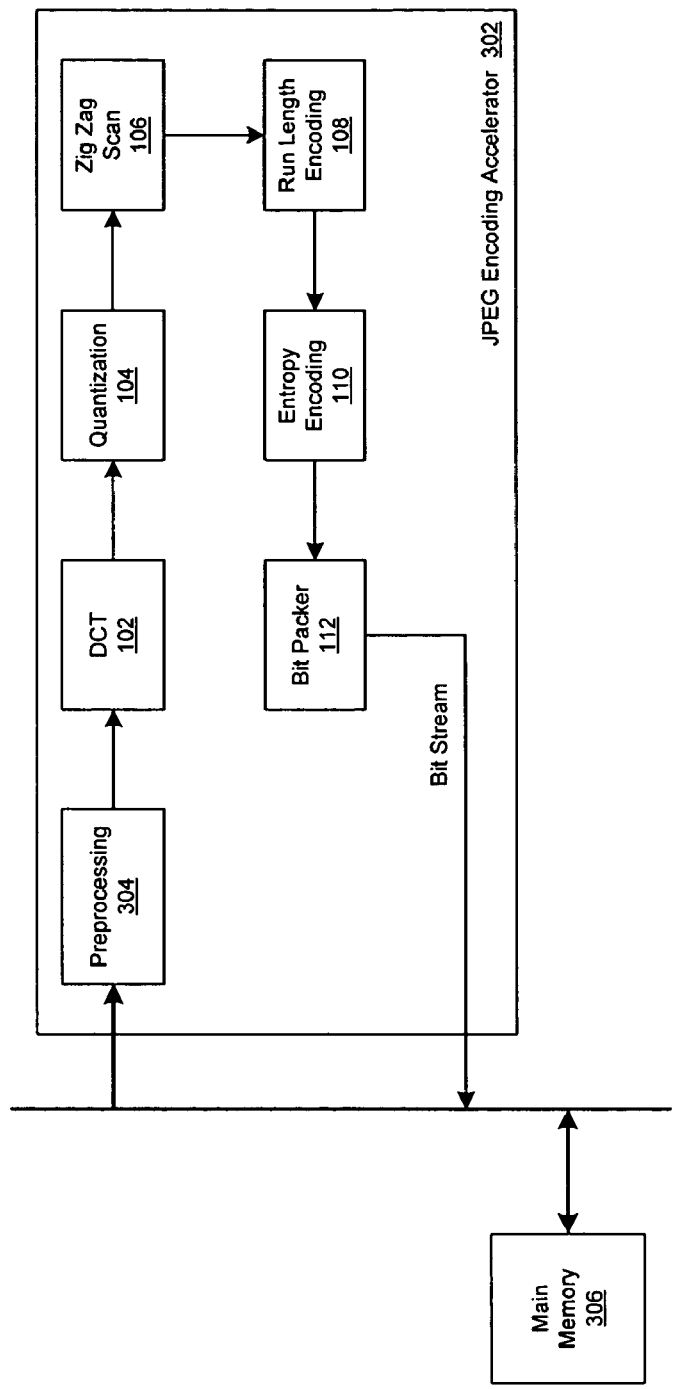
FIG. 3 is a block diagram of an exemplary JPEG encoding accelerator, in accordance with an embodiment of the invention.

FIG. 3 is a block diagram of an exemplary JPEG encoding accelerator in accordance with an embodiment of the invention. Referring to FIG. 3, there is shown a JPEG encoding accelerator 302, and a main memory 306. The JPEG encoding accelerator 302 may comprise a preprocessing block 304, a DCT block 102, a quantization block 104, a zigzag scan block 106, a RLC block 108, an entropy encoding block 110, and a bit packer block 112.

The preprocessing block 304 may comprise suitable logic, circuitry and/or code that may enable preprocessing of data. In an exemplary embodiment of the invention, the preprocessing block 304 may convert an RGB data representation to a YUV data representation.

The main memory 306 may comprise suitable logic, circuitry, and/or code that may enable storing and/or retrieving of data, and/or other information that may be utilized by the JPEG encoding accelerator 302 during operations. Data stored in the main memory 306 may be byte-aligned, or word-aligned. The main memory 306 may enable storage of image data from a camera in an RGB representation, for example. The main memory 306 may enable storage of image data in a YUV representation, for example. The main memory 306 may store results of computations by the preprocessing block 304, DCT block 102, quantization block 104, zigzag scan block 106, RLC block 108, entropy encoding block 110, and/or bit packer block 112. The main memory 306 may enable retrieval of data by the preprocessing block 304, DCT block 102, quantization block 104, zigzag scan block 106, RLC block 108, entropy encoding block 110, and/or bit packer block 112.

In operation, an RGB representation of data may be retrieved from the main memory 306 by the preprocessing block 304. The preprocessing block 304 may convert the RGB representation of the data to a YUV representation of the data.

Figure 4:
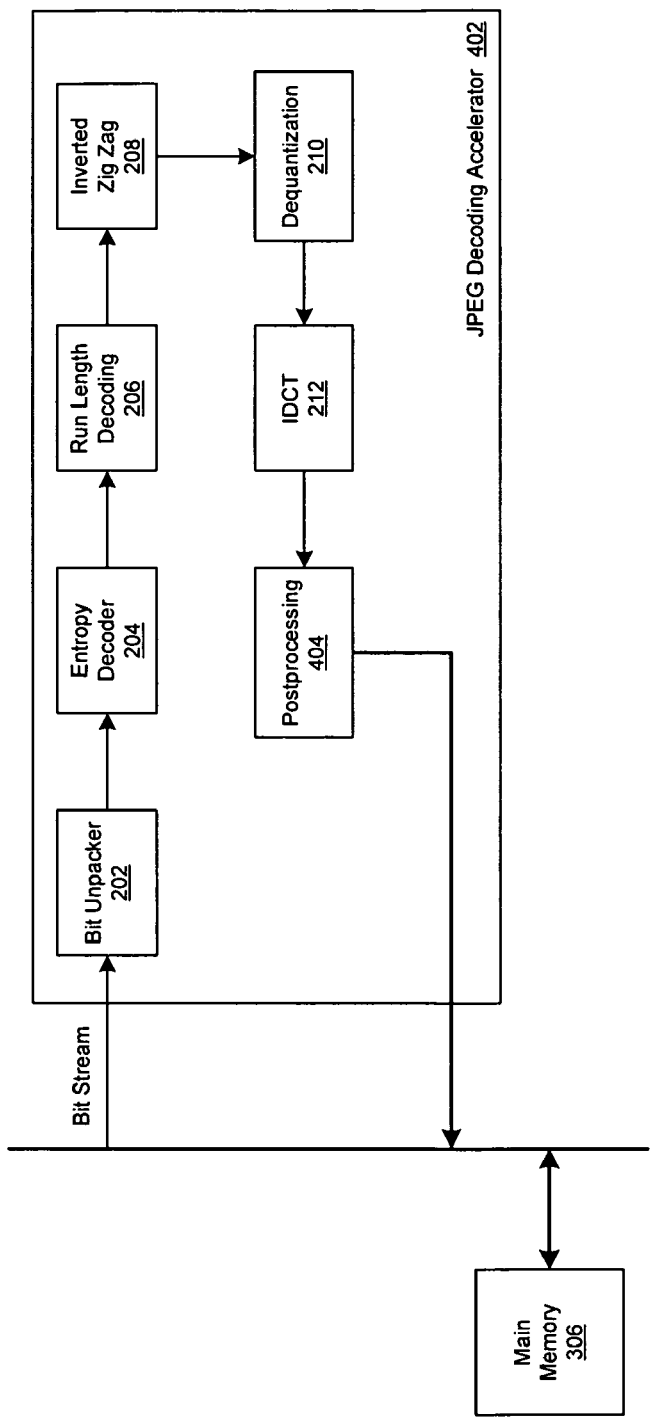
FIG. 4 is a block diagram of an exemplary JPEG decoding accelerator, in accordance with an embodiment of the invention.

FIG. 4 is a block diagram of an exemplary JPEG decoding accelerator in accordance with an embodiment of the invention. Referring to FIG. 4, there is shown a JPEG decoding accelerator 402, and a main memory 306. The JPEG decoding accelerator 402 may comprise a bit unpacker block 202, a entropy decoding block 204, an RLDC block 206, an inverted zigzag scan block 208, a de-quantization block 210, an IDCT block 212, and a post processing block 404.

Each of the bit unpacker block 202, entropy decoding block 204, RLDC block 206, inverted zigzag scan block 208, de-quantization block 210, IDCT block 212 are substantially as described with regards to at least FIG. 2. The entropy decoding block 204 may comprise a Huffman decoder. The post processing block 404 may comprise suitable logic circuitry and/or code that may enable post processing of received data. In an exemplary embodiment of the invention, the post processing block 404 may convert a YUV data representation to an RGB data representation. The transformed block of numerical values may comprise YUV information. The post-processing block 404 may be utilized to perform post processing of data. For example, the post-processing block 404 may convert YUV formatted data to RGB formatted data.

Figure 5A:
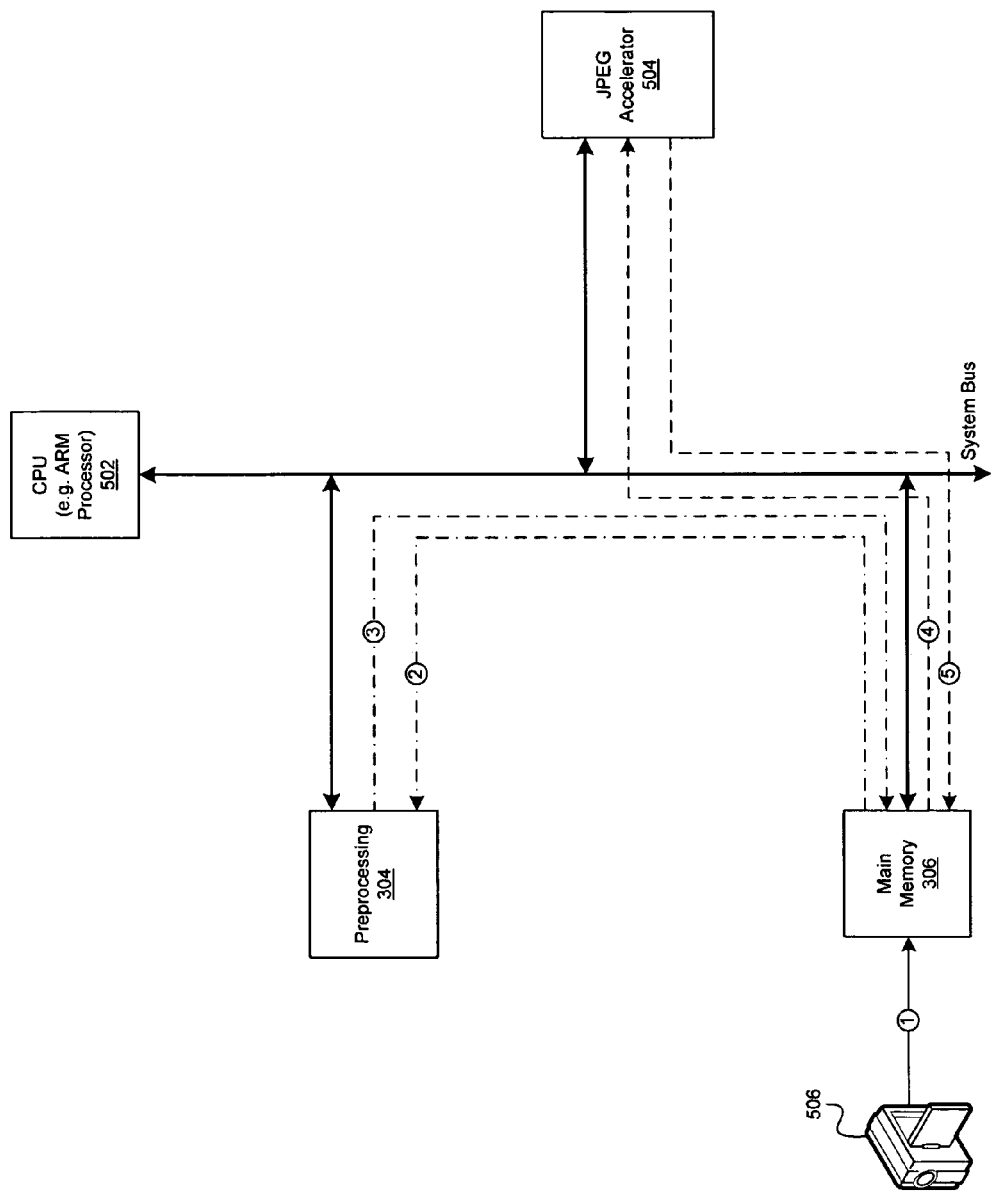
FIG. 5A is diagram illustrating exemplary steps in an encoding process, in accordance with an embodiment of the invention.

FIG. 5A is a diagram illustrating exemplary steps in an encoding process in accordance with an embodiment of the invention. Referring to FIG. 5A, there is shown a central processing unit (CPU) 502, a JPEG accelerator 504, a preprocessing block 304, a main memory 306, and a camera 506. The CPU 502, JPEG accelerator 504, preprocessing block 304, and/or main memory 306 may communicate via a system bus, for example.

The CPU 502 may comprise suitable logic, circuitry, and/or code that may enable execution of software, processing of data, and/or control of system operations. The CPU 502 may generate control signals and/or configuration data that may enable peripheral hardware devices to perform system operations in hardware. The CPU 502 may also receive control signals and/or data from peripheral hardware devices. Based on the received control signals and/or data, the CPU 502 may execute code, process the received data, and/or generate subsequent control signals.

In an embodiment of the invention, the CPU 502 may be implemented in an integrated circuit (IC) device. In another embodiment of the invention, the CPU 502 may be implemented as a processor core that is a component within an IC device, for example, as in a system on a chip (SoC) device. A SoC device may comprise the CPU 502, the JPEG accelerator 504, and/or the preprocessing block 304, for example.

The JPEG accelerator 504 may comprise suitable logic, circuitry and/or code that may enable execution of the functions and operation that may be handled by the JPEG encoding accelerator 302, and/or the JPEG decoding accelerator 402.

The camera 506 may comprise suitable circuitry, logic, and/or code that may enable capturing of a visual image and generation of image data. The camera 506 may also comprise an interface that enables storing of image data, as an RGB representation, for example, in the main memory 306.

Referring to FIG. 5A in operation, the camera 506, may capture an image and store the captured image in RGB format in main memory 306, as indicated by the reference 1 in FIG. 5A. The preprocessing block 304 may retrieve the RGB formatted data from the main memory 306, as indicated by reference 2 in FIG. 5A. The preprocessing block 304 may convert the RGB formatted data to YUV formatted data. The preprocessing block may store the YUV formatted data as indicated by reference 3 in FIG. 5A. The JPEG accelerator 504 may retrieve the YUV formatted data from the main memory 306, as indicated by the reference 4 in FIG. 5A. The JPEG accelerator 504 may encode the YUV data based on DCT and/or entropy encoding. The JPEG accelerator 504 may store the encoded YUV data in the main memory 306, as indicated by reference 5 in FIG. 5A.

Figure 5B:
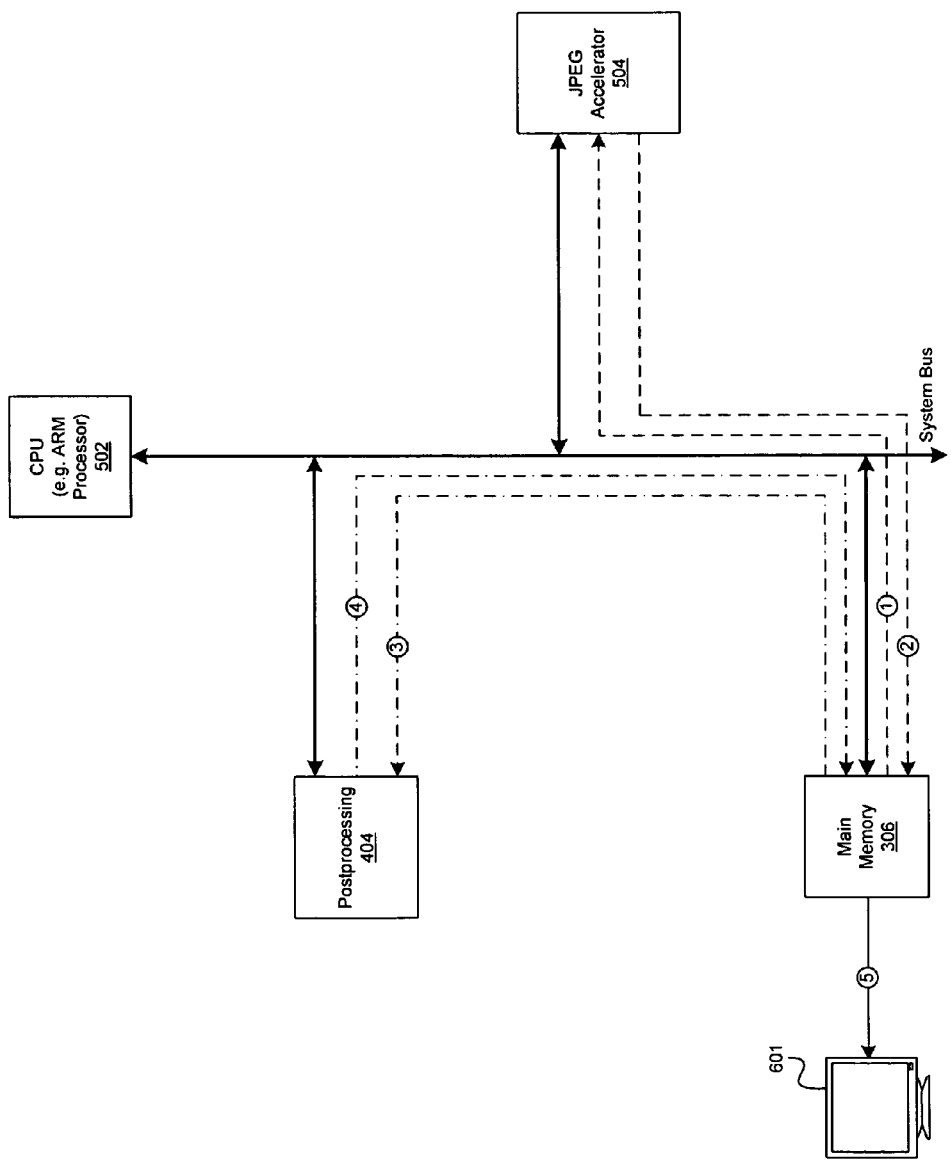
FIG. 5B is diagram illustrating exemplary steps in a decoding process, in accordance with an embodiment of the invention.

FIG. 5B is a diagram illustrating exemplary steps in a decoding process in accordance with an embodiment of the invention. Referring to FIG. 5B, there is shown a central processing unit (CPU) 502, a JPEG accelerator 504, a post processing block 404, a main memory 306, and a display 601. The CPU 502, JPEG accelerator 504, preprocessing block 304, and/or main memory 306 may communicate via a system bus, for example. This central processing unit (CPU) 502, JPEG accelerator 504, post-processing block 404, and/or main memory 306 are substantially as describe with respect to FIG. 1-4.

The display 601 may comprise suitable circuitry, logic, and/or code that may be utilized to display a visual image based on image data. The displayed visual image may be represented as a plurality of pixels arranged in rows and columns. The visual image may be displayed based on a raster scan. Image data, associated with each pixel in an image frame may be displayed by the display 601, which may be, for example, a cathode ray tube (CRT), Plasma, liquid crystal diode (LCD), or other type of display. In one embodiment of the invention, the display 601 may comprise an interface that allows the image data to be retrieved from the main memory 306. For example, the display 601 may comprise and RGB interface that allows RGB formatted data to be retrieved from the main memory 306.

Referring to FIG. 5B in operation, the JPEG accelerator 504 may retrieve encoded data from the main memory 306, as indicated by reference 1 in FIG. 5B. The JPEG accelerator 504 may decode the encoded data based on IDCT and/or entropy decoding. The JPEG accelerator 504 may store the decoded data in the main memory 306, as indicated by reference 2 in FIG. 5B. The post-processing block 404 may retrieve the decoded data from the main memory 306, as indicated by reference 3 in FIG. 5B. The post-processing block may convert a YUV data representation, contained in the decoded data, to an RGB data representation. The post-processing block 404 may store the RGB data representation in the main memory 306, as represented by the number 4 in FIG. 5B. The display 601 may retrieve the RGB data representation of the decoded data from the main memory 306, as represented by the number 5 in FIG. 5B. The retrieved RGB formatted data may be displayed on the video monitor 601

In one embodiment of the invention, the JPEG accelerator 504 may utilize an improved 2-level Huffman decoding table during decoding. The 2-level Huffman decoding table may comprise an index table and a plurality of sub-tables, or sub-arrays comprising Huffman codes arranged according to code size. The index table may record the first entry of each sub-table and entries in the index table may be arranged according to code size. In this regard, during video decoding, an exemplary Huffman code lookup operation may be performed using fewer table lookup cycles compared to conventional Huffman decoding lookup algorithms.

Figure 6:
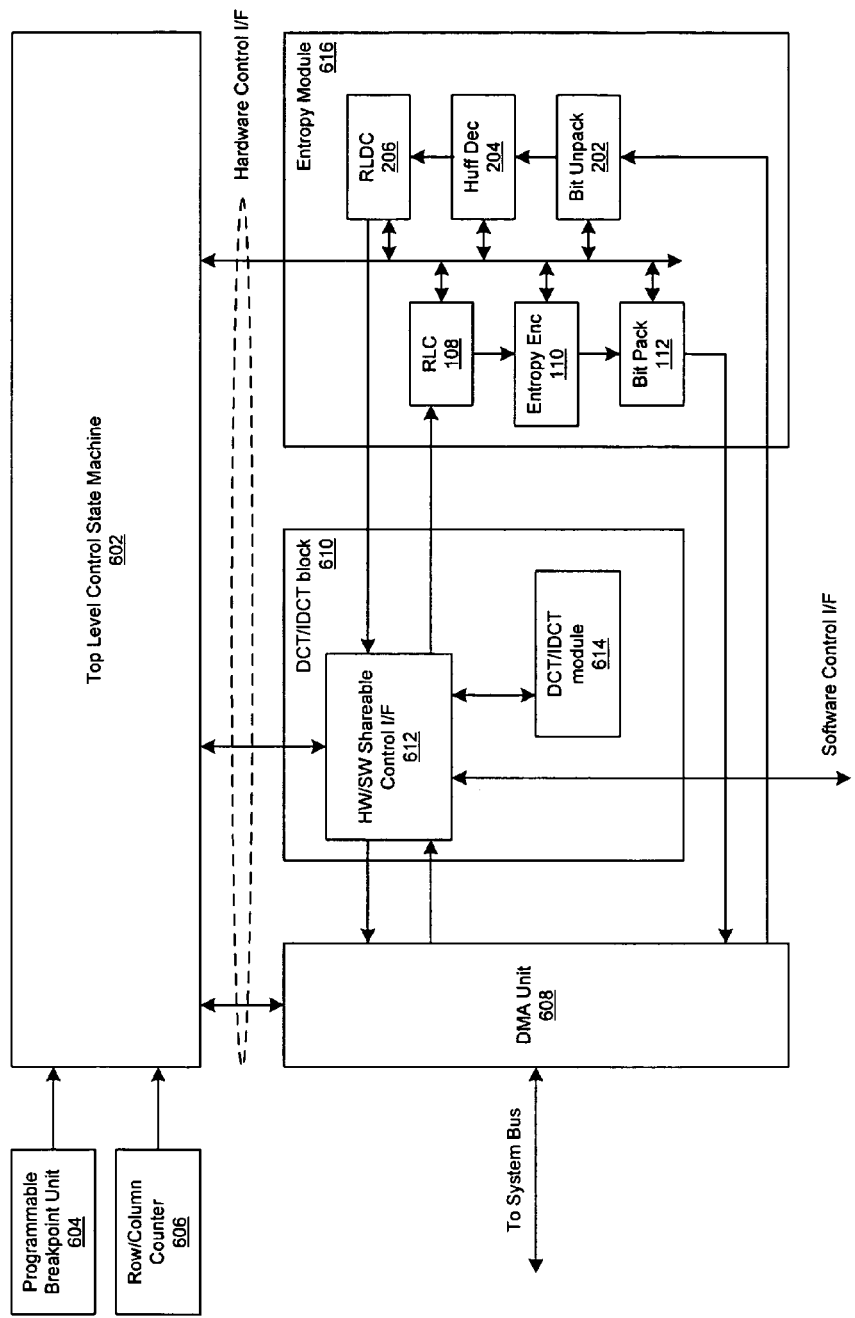
FIG. 6 is a block diagram of a system for pipelined processing in an integrated embedded image and video accelerator in accordance with an embodiment of the invention.

FIG. 6 is a block diagram of a system for pipelined processing in an integrated embedded image and video accelerator in accordance with an embodiment of the invention. The JPEG accelerator 504 may be an exemplary embodiment of an integrated embedded image and video accelerator. Referring to FIG. 6, there is shown a top-level control state machine 602, a programmable breakpoint unit 604, a row and column (row/column) counter block 606, a direct memory access (DMA) unit 608, a DCT and IDCT (DCT/IDCT) block 610, and an entropy module 616. The DCT/IDCT block 610 may comprise a hardware and software (HW/SW) sharable control interface (I/F) 612, and a DCT/IDCT module 614. The entropy coding module 616 may comprise an RLC block 108, an entropy encoding block 110, a bit packing block 112, an RLDC block 206, an entropy decoding block 204, and a bit unpacking block 202.

The top-level control state machine 602 may comprise suitable logic, circuitry, and/or code that may enable controlling of the operation of the DMA unit 608, the DCT/IDCT block 610, and/or the entropy coding module 616 via a hardware control I/F. The top-level control state machine 602 may also receive status information from the DMA unit 608, the DCT/IDCT block 610, and/or the entropy coding module 616 via the hardware control I/F. The top-level control state machine 602 may receive control signals from the programmable breakpoint unit 604 and/or the row/column counter block 606. The top-level control state machine 602 may receive control information from the CPU 502 via a software control I/F. The top-level control state machine 602 may also communicate status information to the CPU 502 via the software control I/F.

For the encoding operation, the CPU 502 may send control signals to the top-level control state machine 602 that enables the JPEG accelerator 504 to encode an image stored in the main memory 306. The top-level control state machine 602 may determine when the JPEG accelerator 504 is to receive a current 8×8 pixel block 100 from the main memory 306. The top-level control state machine 602 may send control signals that enable the DMA unit 608 to retrieve the current 8×8 pixel block 100 from the main memory 306. The received current 8×8 pixel block 100 may be transferred to the DCT/IDCT block 610. The top-level control state machine 602 may send control signals that may enable the DCT/IDCT block 610 to transform and/or quantize the received current 8×8 pixel block 100. The top-level control state machine 602 may receive status information from the DCT/IDCT block 610 that indicates completion of transformation and quantization of the received 8×8 pixel block 100 and generation of a corresponding transformed current 8×8 block.

The top-level control state machine 602 may send control signals that may enable the entropy coding module 616 to perform RLC, entropy coding and/or bit packing on the transformed current 8×8 block. The top-level control state machine 602 may send control signals that enable the DCT/IDCT block 610 to transform and/or quantize a subsequent 8×8 pixel block 100 received from the main memory 306. The DCT/IDCT module may perform transformation and/or quantization operations on the subsequent 8×8 pixel block 100 while the entropy coding module 616 is performing RLC, entropy coding and/or bit packing on the transformed current 8×8 block. The top-level control state machine 602 may receive status information from the entropy coding module 616 that indicates completion of RLC, entropy encoding and/or bit packing on the transformed current 8×8 block and generation of a corresponding encoded bit stream. The top-level control state machine 602 may send control signals that enable the DMA unit 608 to store the encoded bit stream in the main memory 306. The top-level control state machine 602 may subsequently send status information to the CPU 502 to indicate that at least a portion of the image stored in the main memory 306 has been encoded.

For the decoding operation, the CPU 502 may send control signals to the top-level control state machine 602 that enable the JPEG accelerator 504 to decode encoded data stored in the main memory 306. The top-level control state machine 602 may determine when the JPEG accelerator 504 is to receive a current encoded bit stream from main memory 306. The top-level control state machine 602 may send control signals that enable the DMA unit 608 to retrieve the current encoded bit stream from the main memory 306. The current encoded bit stream may be transferred to the entropy coding module 616.

The top-level control state machine 602 may send control signals that may enable the entropy coding module 616 to perform bit unpacking, entropy decoding and/or RLDC on the current encoded bit stream. The top-level control state machine 602 may receive status information from the entropy coding module 616 that indicates completion of bit unpacking, entropy decoding, and/or RLDC on the current encoded bit stream and generation of a corresponding decoded current encoded bit stream.

The top-level control state machine 602 may send control signals that may enable the DCT/IDCT block 610 to perform IDCT and/or inverse quantization on the decoded current encoded bit stream. The top-level control state machine 602 may receive status information from the DCT/IDCT block 610 that indicates completion of IDCT and/or inverse quantization of the decoded current encoded bit stream and generation of a decoded 8×8 pixel block 214. The top-level control state machine 602 may send control signals that enable the DMA unit 608 to store the decoded 8×8 pixel block 214 in the main memory 306. The top-level control state machine 602 may subsequently send status information to the CPU 502 to indicate that at least a portion of the encoded data associated with an image has been decoded and/or stored in the main memory 306.

The ability of the JPEG accelerator 504, for example, to perform transformation and/or quantization operations on a subsequent 8×8 block in the DCT/IDCT block 610 while the entropy coding module 616 performs RLC, entropy encoding, and/or bit packing operations on a transformed current 8×8 block may be referred to as pipelined processing. The ability of the JPEG accelerator 504, for example, to perform bit unpacking, entropy decoding and/or RLDC on a subsequent encoded bit stream in the entropy coding module 616 while the DCT/IDCT block 610 performs IDCT and/or inverse quantization operations on a decoded current encoded bit stream may also be referred to as pipelined processing.

The programmable breakpoint unit 604 may comprise suitable logic, circuitry, and/or code that may be utilized to generate an indication that the JPEG accelerator 504 has completed transformation and encoding processing of a specific 8×8 pixel block 100. Transformation processing may comprise DCT and/or quantization. Encoding processing may comprise RLC, entropy encoding, and/or bit packing. The programmable breakpoint unit 604 may also be utilized to generate an indication that the JPEG accelerator 504 has completed decoding and inverse transformation processing of a specific 8×8 pixel block 214. Decoding processing may comprise bit unpacking, entropy decoding and/or RLDC. Inverse transformation processing may comprise inverse quantization and/or IDCT. The row/column counter block 606 may comprise suitable logic, circuitry, and/or code that may be utilized to a current row and/or current column location associated with an 8×8 pixel block 100 and/or 8×8 pixel block 214 in a picture or a video frame. For the encoding operation, the row/column counter block 606 may indicate a current row and/or column location associated with an 8×8 pixel block 100 in an image or a video frame. For the decoding operation, the row/column counter block 606 may indicate a current row and/or column location associated with an 8×8 pixel block 214 in an image or a video frame.

The DMA unit 608 may comprise suitable logic, circuitry, and/or code that may enable retrieval and/or storing of a block of data from/to the main memory 306, respectively. The DMA unit 608 may receive control signals from the top-level control state machine 602 that enables a block of data to be retrieved and/or stored from/to the main memory 306, respectively. The DMA unit 608 may retrieve and/or store a block of data from/to the main memory 306 via a system bus. The DMA unit 608 may receive control signals from the top level control state machine that enable a block of data to be retrieved and/or stored from/to the DCT/IDCT block 610. The DMA unit 608 may send status information to the top-level control state machine 602 that indicates when a block of data has been retrieved and/or stored from/to the main memory 306. The DMA unit 608 may send status information to the top-level control state machine 602 that indicates when a block of data has been retrieved and/or stored from/to the DCT/IDCT block 610.

The ability of the JPEG accelerator 504, for example, to retrieve and/or store a block of data from/to the main memory 306 in the DMA 608 unit while DCT/IDCT 610 perform transformation and/or quantization operations on a subsequent 8×8 block may be referred to as pipelined processing. In decoding processing, the ability of the JPEG accelerator 504, for example, to perform and/or inverted quantization and/or transformation operations on a subsequent 8×8 block in DCT/IDCT 610 while DMA 608 retrieve and/or store a block of data from/to the main memory 306 may also be referred to as pipelined processing The DCT/IDCT block 610 may comprise suitable logic, circuitry, and/or code that may enable DCT, IDCT, quantization, and/or inverse quantization on received data. The operation of the DCT/IDCT block 610 may be controlled by the HW/SW sharable control I/F 612, via a programmable interface. The DCT/IDCT module 614 may perform DCT, IDCT, quantization, and/or inverse quantization processing. The DCT/IDCT module 614 may receive control signals and/or data from the HW/SW sharable control I/F 612.

The HW/SW sharable control I/F 612 may comprise suitable logic, circuitry, and/or code that may enable operation of the DCT/IDCT module 614. The HW/SW sharable control I/F 612 may receive control signals from the top-level control state machine 602 and/or from the CPU 502. The HW/SW sharable control I/F 612 may also send status information to the top-level control state machine 602 and/or to the CPU 502. The received control signals may enable the HW/SW sharable control I/F 612 to receive and/or send an 8×8 block of data. The received control signals may also enable the HW/SW sharable control I/F 612 to receive and/or send a bit stream. The received control signals may also enable the HW/SW sharable control I/F 612 to send control signals and/or data to the DCT/IDCT module 614.

For the encoding operation the HW/SW sharable control I/F 612 may send an 8×8 block of data to the DCT/IDCT module 614 for transformation processing. At the completion of transformation processing on the 8×8 block of data, the HW/SW sharable control I/F 612 may receive a corresponding transformed block of data from the DCT/IDCT module 614. For the decoding operation the HW/SW sharable control I/F 612 may send an 8×8 block of data to the DCT/IDCT module 614 for inverse transformation processing. At the completion of inverse transformation processing on the 8×8 block of data, the HW/SW sharable control I/F 612 may receive a corresponding inverse transformed block of data from the DCT/IDCT module 614.

The entropy coding module 616 may comprise suitable logic, circuitry, and/or code that may enable RLC, RLDC, entropy encoding, entropy decoding, bit packing, and/or bit unpacking operation on received data. The RLC block 108, entropy encoding block 110, the bit packer block 112, the bit unpacker block 202, the entropy decoding block 204, and the RLDC block 206 may each receive control signals from the top-level control state machine 602. The control signals the RLC block 108, entropy encoding block 110, bit packer block 112, bit unpacker block 202, entropy decoding block 204, and/or RLDC block 206 to perform their respective function on received data. The RLC block 108, entropy encoding block 110, the bit packer block 112, the bit unpacker block 202, the entropy decoding block 204, and the RLDC block 206 may also send status information to the top-level control state machine 602.

The ability of the RLC block 108 to perform RLC operations on a subsequent bit stream while the entropy encoding block 110 performs entropy encoding operations on an RLC current bit stream may be referred to as pipelined processing. The ability of the bit packing block 112 to insert stuff bits into an entropy encoded current bit stream while the entropy encoding block 110 performs entropy encoding operations on an RLC subsequent bit stream may also be referred to as pipelined processing. The ability of the bit unpacking block 202 to remove stuff bits from a subsequent encoded bit stream while the entropy decoding block 204 performs entropy decoding operations on an unstuffed current encoded bit stream may be referred to as pipelined processing. The ability of the entropy decoding block 204 to perform entropy decoding on an unstuffed subsequent encoded bit stream while the RLDC block 206 performs RLDC operations on an entropy decoded current encoded bit stream may also be referred to as pipelined processing.

In operation, the CPU 502 may send control signals to the top level state machine 702 via the software control I/F. The control signals may instruct the JPEG accelerator 504 to encode an image stored in the main memory 306. The row/column counter 706 may comprise information indicating what portion of the image has been transformed by the DCT/IDCT block 610. The row/column counter 706 may also comprise information indicating what portion of the transformed image has currently been encoded by the entropy coding module 616. Status information from the programmable breakpoint unit 604 and/or the row/column counter 706 may be utilized by the top-level control state machine 602 to generate control signals and/or status information. The top-level control state machine 602 may select an 8×8 pixel block 100 from the stored image. The top-level control state machine 602 may configure the programmable breakpoint unit 604 to generate status information to indicate when the DCT/IDCT block 610 has completed transform operations on the selected 8×8 pixel block 100. The programmable breakpoint unit may also be configured to generate status information to indicate when the entropy coding module 616 has completed encoding operations on a transformed selected 8×8 block.

For the encoding operation, the top-level control state machine 602 may generate control signals that enable the DMA unit 608 to transfer data from the selected 8×8 pixel block 100 from the main memory 306, to the HW/SW sharable control I/F block 612. The HW/SW sharable control I/F block 612 may enable the DCT/IDCT module 614 to perform DCT and quantization operations on the selected 8×8 pixel block 100. The transformed selected 8×8 block may be stored in the HW/SW sharable control I/F block 612. The top-level control state machine 602 may generate control signals that enable the DCT/IDCT block 610 to transfer at least a portion of the transformed selected 8×8 block to the RLC block 108. The top-level control state machine 602 may generate control signals that enable the RLC block 108, encoding block 110, and/or the bit packer block 112 to perform encoding operations on the transformed selected 8×8 block. Upon completion of encoding operations on the transformed selected 8×8 block. The top-level control state machine 602 may send control signals that enable the DMA unit 608 to transfer an encoded bit stream from the bit packer block 112 to the main memory 306. The top-level control state machine 602 may send status information to the CPU 502, if the current block is the specified one in the programmable breakpoint unit 604.

For the decoding operation, the top-level control state machine 602 may generate control signals that enable the DMA unit 608 to transfer encoded data from the main memory 306, to the bit unpacker block 202. The top-level control state machine 602 may generate control signals that enable the bit unpacker block 202, the entropy decoding block 204, and/or the RLDC block 206 to perform decoding operations on the transferred encoded data. Upon completion of decoding operations on the transferred encoded data, the top-level control state machine 602 may generate control signals that enable the Entropy Coding module 616 to transfer at least a portion of a decoded bit stream to the HW/SW sharable control I/F block 612.

The HW/SW sharable control I/F block 612 may enable the DCT/IDCT module 614 to perform IDCT and inverse quantization operations on the decoded bit stream. An inverse transformed 8×8 block may be stored as a decoded 8×8 pixel block 214 in the HW/SW sharable control I/F block 612. The top-level control state machine 602 may generate control signals that enable the DMA unit 608 to transfer the decoded 8×8 pixel block 214 from the HW/SW sharable control I/F block 612 to the main memory 306.

Upon completion of inverse transformation operations on the decoded 8×8 pixel block 214, the programmable breakpoint unit 604 may send status information to the top-level control state machine 602. The top-level control state machine 602 may send control signals that enable the DMA unit 608 to transfer the decoded 8×8 pixel block 214 from the HW/SW sharable control I/F block 612 to the main memory 306. The top-level control state machine 602 may send status information to the CPU 502. The software control I/F may enable the CPU 502 to provide control signals to the HW/SW sharable control I/F 612. By utilizing this interface, the DCT/IDCT block 610 may perform operations under software control. For example, utilizing the software control I/F to the HW/SW sharable control I/F 612 may enable the DCT/IDCT block 610 to perform gamma correction on a decoded 8×8 pixel block.

Figure 7A:
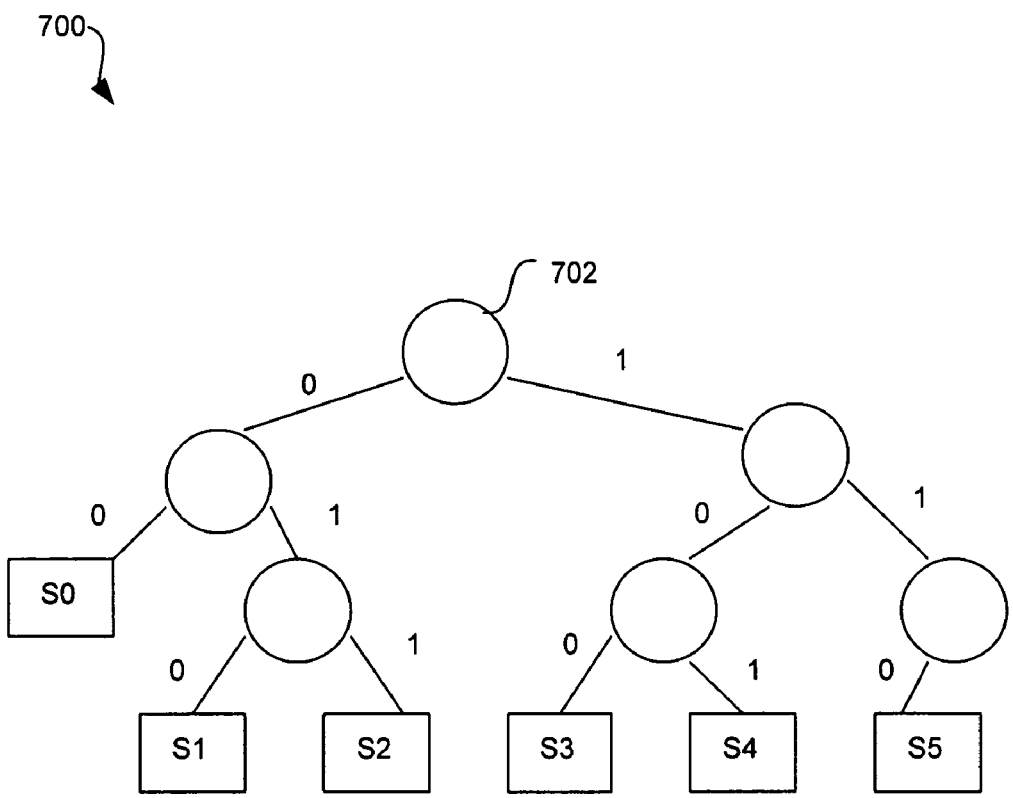
FIG. 7A is a diagram of an exemplary Huffman decoding tree, which may be utilized in accordance with an embodiment of the invention.

FIG. 7A is a diagram of an exemplary Huffman decoding tree, which may be utilized in accordance with an embodiment of the invention. Referring to FIG. 7, the Huffman decoding tree 700 may be used in accordance with an exemplary Huffman decoding algorithm. An exemplary Huffman decoding algorithm is disclosed in the article by Pi-C. Wang, et al., "A Memory-efficient Huffman Decoding Algorithm," Proceedings of the 19$^{th}$ International Conference on Advanced Information Networking and Applications (AINA '05) (hereinafter, the Wang Reference).

During Huffman decoding of an encoded bitstream, a plurality of codewords, corresponding to source words s0, . . . , s5, may be generated utilizing the Huffman decoding tree 700 by tracing the path from the tree starting point 702 to the corresponding source word. For example s0=00, s1=010, s2=011, s3=100, s4=101, and s5=110. The source words s0, . . . , s5 and their corresponding codewords may be arranged in a table, which may be referred to as a Huffman decoding table. Such Huffman decoding table may be stored in memory. An encoded bitstream may be parsed and a Huffman decoding table generated from the Huffman tree 700 may be utilized for decoding the bitstream. For example, bits from the bitstream may be matched with a codeword from the Huffman decoding table and a source word corresponding to the matched codeword may be communicated as a decoded output.

Since a Huffman decoding table may comprise a plurality of entries, storing the Huffman decoding table or the Huffman tree may utilize significant memory resources. Various methods may be used to reduce the memory usage when storing the Huffman tree or the Huffman decoding table. For example, the data structure proposed in the Wang Reference stores the "leaves" of the Huffman decoding tree. In this regard, the data structure in the Wang Reference converts all the codewords to the same length, N, by padding zeros at the end of the codewords, where N is the length of the longest code. The codewords of length N are then re-ordered in a Huffman decoding table in ascending order. Conventional decoding techniques may use the Huffman decoding algorithm and data structure disclosed by the Wang Reference. However, long codewords and short codewords require the same number of lookup cycles during decoding, which may significantly increase the overall processing time for decoding.

Figure 7B:
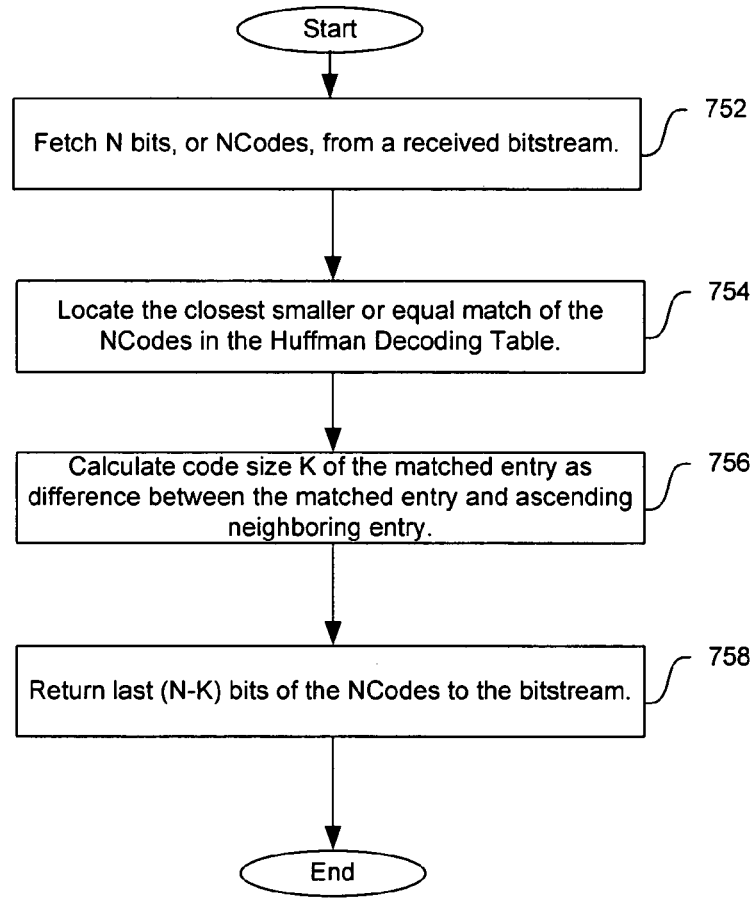
FIG. 7B is a flow diagram illustrating exemplary steps for Huffman decoding using a Huffman decoding table, in accordance with an embodiment of the invention.

FIG. 7B is a flow diagram illustrating exemplary steps for Huffman decoding using a Huffman decoding table, in accordance with an embodiment of the invention. Referring to FIGS. 2 and 7B, at 752, a Huffman decoder such as the Huffman decoder block 204 in FIG. 2 may acquire N bits from a received encoded bitstream. The acquired N bits may be referred to as NCodes. At 754, the Huffman decoder 204 may locate the closest smaller or equal match of the NCodes in the Huffman decoding table. In this regard, the Huffman decoder 204 may utilize a binary searching lookup table (LUT) algorithm. At 756, the Huffman decoder 204 may calculate a code size K of the matched entry. For example, the Huffman decoder 204 may calculate the code size K of the matched entry as a difference between the matched entry and an ascending neighboring entry. After determining the code size K, at 758, the Huffman decoder 204 may return the last (N-K) bits from the acquired NCodes to the bitstream. A source word corresponding to the matched codeword may be utilized as the result of decoding the NCodes.

If an exemplary Huffman decoding table comprises M Huffman codes, or M entries in the Huffman decoding table, a binary searching LUT algorithm may require at least int (log 2M) cycles to determine the closest smaller match. The number of Huffman codes in the JPEG specification is 160, or M=160. Therefore, conventional LUT algorithms may utilize a plurality of lookup cycles, in some instances as many as 8 cycles, to decode each Huffman code. For example, the Wang Reference discloses use of a multiple-level table structure for Huffman decoding. To improve the LUT performance, the Wang Reference divides the Huffman decoding table into multiple smaller sub-arrays, or sub-tables, with size of power of 2. However, the shortcoming of the conventional LUT algorithms and Huffman decoding table structures, such as the Huffman decoding table disclosed by the Wang Reference, is that long Huffman codes and short Huffman codes utilize the same lookup cycle number during decoding.

In one embodiment of the invention, conventional LUT algorithms may be improved by using a 2-level Huffman decoding table as disclosed herein. Since the Huffman codes are variable-length codes with the short codes appearing more frequently than the long codes, a Huffman decoder using the 2-level Huffman decoding table may utilize fewer LUT cycles to decode short codes compared to the LUT cycles for decoding the long codes.

Figure 8:
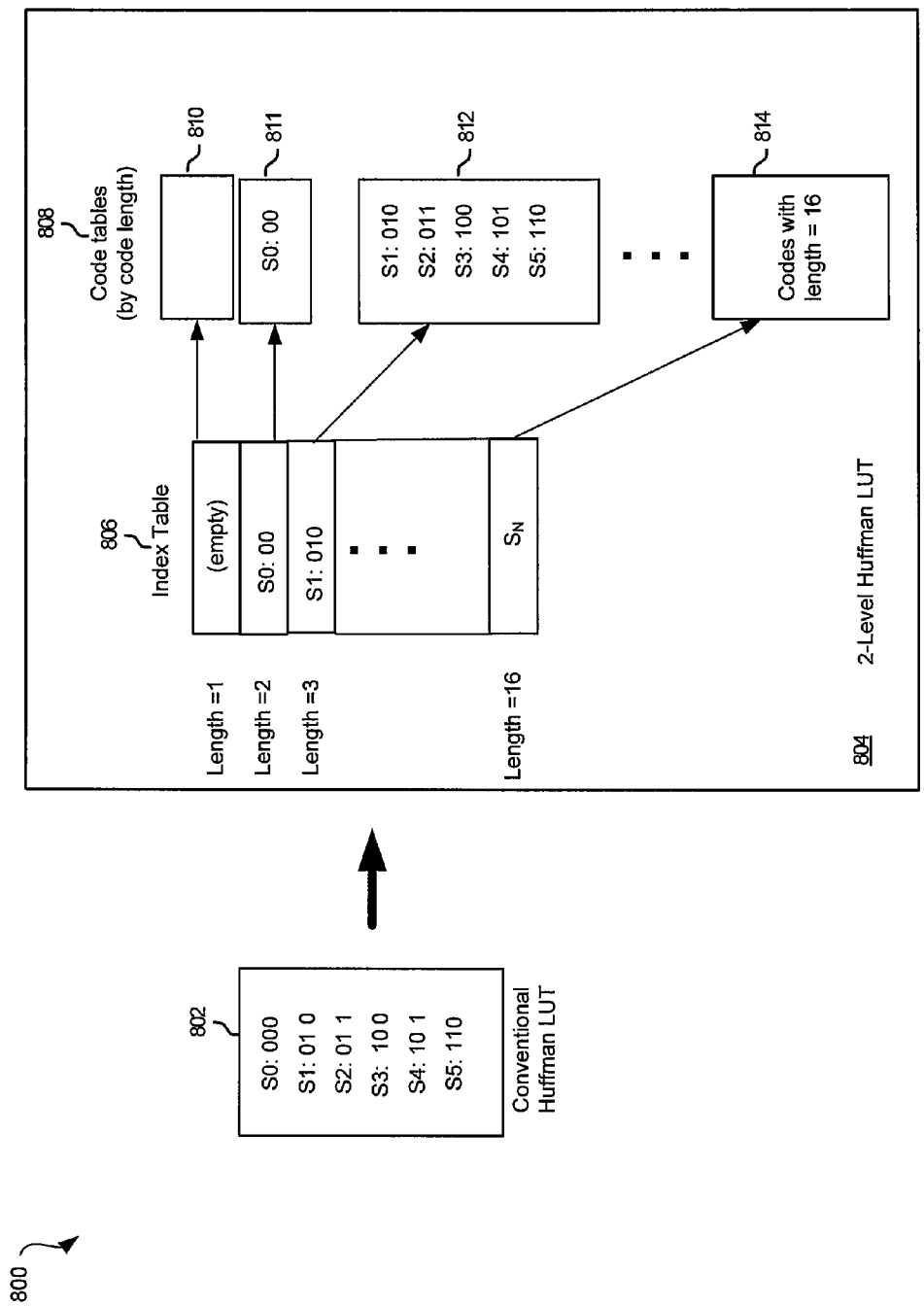
FIG. 8 is a diagram of exemplary 2-level Huffman decoding table, in accordance with an embodiment of the invention.

FIG. 8 is a diagram of exemplary 2-level Huffman decoding table, in accordance with an embodiment of the invention. Referring to FIG. 8, a conventional Huffman decoding table 802 may be converted to a 2-level Huffman decoding table 804. The 2-level Huffman decoding table 804 may comprise an index table 806 and a plurality of sub-arrays or sub-tables 808. The sub-tables 808 may comprise code tables 810, . . . , 814.

The conventional Huffman decoding table 802 may be similar to the exemplary Huffman decoding table disclosed in the Wang Reference and may be generated using the Huffman decoding tree 700 in FIG. 7A. A plurality of entries in the Huffman decoding table 802 may be "padded" with extra symbols such as zero, so that all entries in the Huffman decoding table 802 may be of the same length. For example, source word s0 may be encoded as "00", as illustrated in FIG. 7A. However, an extra "0" may be added so that s0="000" may appear in the Huffman decoding table 802. The conventional Huffman decoding table 802 may be converted to a 2-level Huffman decoding table, thereby significantly reducing the lookup cycle duration and improving decoding performance.

The 2-level Huffman decoding table 804 may be divided into multiple sub-arrays 810, . . . , 814 according to the codeword length prior to any zero padding. For example, a first sub-array or sub-table 810 may comprise one or more codewords with a size of one. The second sub-array 811 may comprise codewords with a size of two, and the sixteenth sub-array 814 may comprise one or more codewords with a size of 16. The index table 806 may comprise the starting entries of the sub-arrays 810, . . . , 814, arranged according to the codeword length of the corresponding sub-arrays. For example, the first entry in the index table 806 may point to codeword entries with a length of 1, which may be located in sub-array 810. Similarly, the last entry in the index table 806 may point to codeword entries with a length of 16, which may be located in sub-array 814. The Huffman code size defined in the default table of the JPEG specification may be up to 16, so the index table 806 may comprise 16 entries.

Figure 9:
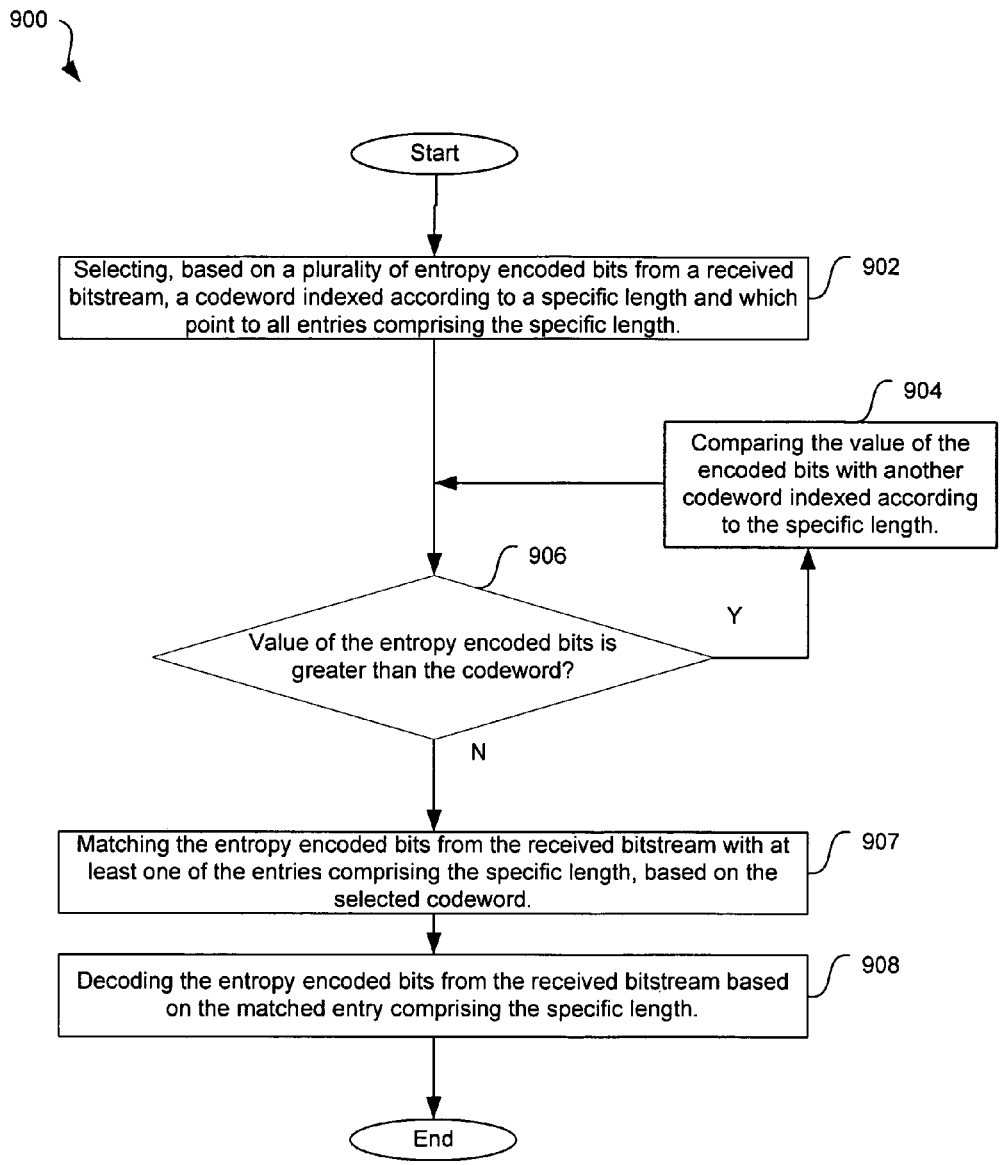
FIG. 9 is a flow diagram illustrating exemplary steps for Huffman decoding using a 2-level Huffman decoding table, in accordance with an embodiment of the invention.

FIG. 9 is a flow diagram illustrating exemplary steps for Huffman decoding using a 2-level Huffman decoding table, in accordance with an embodiment of the invention. Referring to FIGS. 2, 8 and 9, the Huffman decoder 204 may be enabled to use a 2-level Huffman decoding table, such as the 2-level Huffman decoding table 804. At 902, the Huffman decoder may select a codeword from index table 806 which points to entries in one of the sub-tables 810, . . . , 814, based on a plurality of entropy encoded bits from a received bitstream. In this regard, during an exemplary lookup cycle, the index table 806 may be looked up against a portion of encoded bitstream, or NCodes, for a match. At 906, it may be determined whether a value of the entropy encoded bits is greater than the codeword selected from the index table 806. If value of the entropy encoded bits is greater than the codeword selected from the index table 806, at 904, the value of the entropy encoded bits may be compared to another codeword from the index table 806.

If the value of the entropy encoded bits is not greater than the codeword. selected from the index table 806, at 907, the entropy encoded bits from the received bitstream may be matched with at least one of the entries from a sub-table corresponding to the codeword selected from the index table 806. A match of the entropy bits with a codeword from the index table 806 may indicate not only which sub-array to look up during decoding, but it may also indicate the codeword size K, prior to any bit padding of the codewords. At 908, the entropy encoded bits from the received bitstream may be decoded based on the matched sub-table entry comprising the specific length.

The approach described herein may provide for coding and decoding operations for multimedia image and video applications in a relatively small area in a signal processing IC that is computationally efficient and operationally flexible. Accordingly, aspects of the invention may be realized in hardware, software, firmware or a combination thereof. The invention may be realized in a centralized fashion in at least one computer system or in a distributed fashion where different elements are spread across several interconnected computer systems. Any kind of computer system or other apparatus adapted for carrying out the methods described herein is suited. A typical combination of hardware, software and firmware may be a general-purpose computer system with a computer program that, when being loaded and executed, controls the computer system such that it carries out the methods described herein.

One embodiment of the present invention may be implemented as a board level product, as a single chip, application specific integrated circuit (ASIC), or with varying levels integrated on a single chip with other portions of the system as separate components. The degree of integration of the system will primarily be determined by speed and cost considerations. Because of the sophisticated nature of modern processors, it is possible to utilize a commercially available processor, which may be implemented external to an ASIC implementation of the present system. Alternatively, if the processor is available as an ASIC core or logic block, then the commercially available processor may be implemented as part of an ASIC device with various functions implemented as firmware.

The present invention may also be embedded in a computer program product, which comprises all the features enabling the implementation of the methods described herein, and which when loaded in a computer system is able to carry out these methods. Computer program in the present context may mean, for example, any expression, in any language, code or notation, of a set of instructions intended to cause a system having an information processing capability to perform a particular function either directly or after either or both of the following: a) conversion to another language, code or notation; b) reproduction in a different material form. However, other meanings of computer program within the understanding of those skilled in the art are also contemplated by the present invention.

While the invention has been described with reference to certain embodiments, it will be understood by those skilled in the art that various changes may be made and equivalents may be substituted without departing from the scope of the present invention. In addition, many modifications may be made to adapt a particular situation or material to the teachings of the present invention without departing from its scope. Therefore, it is intended that the present invention not be limited to the particular embodiments disclosed, but that the present invention will include all embodiments falling within the scope of the appended claims.

What is claimed is:

1. A method for processing information, the method comprising:
   selecting, based on a plurality of entropy encoded bits from a received bitstream, one of a plurality of codewords that is indexed according to a specific length and that points to all codeword entries comprising said specific length; and
   matching said plurality of entropy encoded bits from said received bitstream with at least one of said codeword entries comprising said specific length.

2. The method according to claim 1, wherein said codeword entries comprising said specific length are stored in a table in memory.

3. The method according to claim 1, comprising comparing a value of said plurality of entropy encoded bits with said selected one of said plurality of codewords that is indexed according to said specific length.

4. The method according to claim 3, wherein said value of said plurality of entropy encoded bits comprises a binary value.

5. The method according to claim 3, comprising, if said value of said plurality of entropy encoded bits is greater than said selected one of said plurality of codewords that is indexed according to said specific length, comparing said value of said plurality of entropy encoded bits with another one of said plurality of codewords that is indexed according to said specific length.

6. The method according to claim 3, comprising, if said value of said plurality of entropy encoded bits is not greater than said selected one of said plurality of codewords that is indexed according to said specific length, matching said plurality of entropy encoded bits from said received bitstream with said at least one of said codeword entries comprising said specific length, based on said selected one of said plurality of codewords.

7. The method according to claim 1, comprising decoding said plurality of entropy encoded bits from said received bitstream based on said matched at least one of said codeword entries comprising said specific length.

8. A machine-readable storage having stored thereon, a computer program having at least one code section for processing information, the at least one code section being executable by a machine for causing the machine to perform steps comprising:
   selecting, based on a plurality of entropy encoded bits from a received bitstream, one of a plurality of codewords that is indexed according to a specific length and that points to all codeword entries comprising said specific length; and
   matching said plurality of entropy encoded bits from said received bitstream with at least one of said codeword entries comprising said specific length.

9. The machine-readable storage according to claim 8, wherein said codeword entries comprising said specific length are stored in a table in memory.

10. The machine-readable storage according to claim 8, comprising code for comparing a value of said plurality of entropy encoded bits with said selected one of said plurality of codewords that is indexed according to said specific length.

11. The machine-readable storage according to claim 10, wherein said value of said plurality of entropy encoded bits comprises a binary value.

12. The machine-readable storage according to claim 10, comprising code for comparing said value of said plurality of entropy encoded bits with another one of said plurality of codewords that is indexed according to said specific length, if said value of said plurality of entropy encoded bits is greater than said selected one of said plurality of codewords that is indexed according to said specific length.

13. The machine-readable storage according to claim 10, comprising code for matching said plurality of entropy encoded bits from said received bitstream with said at least one of said codeword entries comprising said specific length based on said selected one of said plurality of codewords, if said value of said plurality of entropy encoded bits is not greater than said selected one of said plurality of codewords that is indexed according to said specific length.

14. The machine-readable storage according to claim 8, comprising code for decoding said plurality of entropy encoded bits from said received bitstream based on said matched at least one of said codeword entries comprising said specific length.

15. A system for processing information, the system comprising:
   at least one processor that enables selection of one of a plurality of codewords that is indexed according to a specific length and that points to all codeword entries comprising said specific length, based on a plurality of entropy encoded bits from a received bitstream; and
   said at least one processor enables matching of said plurality of entropy encoded bits from said received bitstream with at least one of said codeword entries comprising said specific length.

16. The system according to claim 15, wherein said codeword entries comprising said specific length are stored in a table in memory.

17. The system according to claim 15, wherein said at least one processor enables comparison of a value of said plurality of entropy encoded bits with said selected one of said plurality of codewords that is indexed according to said specific length.

18. The system according to claim 17, wherein said value of said plurality of entropy encoded bits comprises a binary value.

19. The system according to claim 17, wherein said at least one processor enables comparison of said value of said plurality of entropy encoded bits with another one of said plurality of codewords that is indexed according to said specific length, if said value of said plurality of entropy encoded bits is greater than said selected one of said plurality of codewords that is indexed according to said specific length.

20. The system according to claim 17, wherein said at least one processor enables matching of said plurality of entropy encoded bits from said received bitstream with said at least one of said codeword entries comprising said specific length based on said selected one of said plurality of codewords, if said value of said plurality of entropy encoded bits is not greater than said selected one of said plurality of codewords that is indexed according to said specific length.

21. The system according to claim 15, wherein said at least one processor enables decoding of said plurality of entropy encoded bits from said received bitstream based on said matched at least one of said codeword entries comprising said specific length.

* * * * *